United States Patent [19]

Viswanathan

[11] Patent Number: 5,532,628
[45] Date of Patent: Jul. 2, 1996

[54] FAST COMPARATOR CIRCUIT

[75] Inventor: Thayamkulangara R. Viswanathan, Albany Township, Berks County, Pa.

[73] Assignee: AT&T Corp., Murray Hill, N.J.

[21] Appl. No.: 527,989

[22] Filed: Sep. 13, 1995

Related U.S. Application Data

[63] Continuation of Ser. No. 163,957, Dec. 8, 1993, abandoned.
[51] Int. Cl.[6] .......................... H03K 5/153; H03K 3/356; G01R 19/00
[52] U.S. Cl. .............................. 327/77; 327/210; 327/57
[58] Field of Search .................... 307/530, 350, 307/362, 279; 365/205, 210, 227; 327/51, 57, 55, 56, 50, 77, 208, 210, 214

[56] References Cited

U.S. PATENT DOCUMENTS

| | | | |
|---|---|---|---|
| 4,169,233 | 9/1979 | Haraszti | 307/530 |
| 4,558,241 | 12/1985 | Suzuki et al. | 307/530 |
| 4,680,735 | 7/1987 | Miyamoto et al. | 365/210 |
| 5,022,009 | 6/1991 | Terada et al. | 365/210 |
| 5,127,739 | 7/1992 | Duvvury et al. | 365/205 |
| 5,226,014 | 7/1993 | McMarus | 365/210 |
| 5,243,573 | 9/1993 | Makihara et al. | 365/210 |

OTHER PUBLICATIONS

Uyemura, "Fundamentals of MOS Digital Integrated Circuits", Addison–Wesley Company, 1988, pp. 74–75.
Rahul Sarpeshkar, et al., "Mismatch Sensitivity of a Simultaneously Latched CMOS Sense Amplifier," IEEE Journal of Solid–State Circuits, vol. 26, No. 10, Oct., 1991, pp. 1413–1422.

Primary Examiner—Toan Tran

[57] ABSTRACT

A circuit for comparing an input signal having a first voltage to a reference signal having a second voltage to determine whether the input signal voltage is greater than or less than the reference signal voltage. In a preferred embodiment, the circuit essentially employs only four transistors (two inverters). First and second complimentary transistors are coupled in series to form the first inverter. Third and fourth complimentary transistors are coupled in series to form the second inverter. Between the first and second complimentary transistors is a first node and between the third and fourth transistors is a second node. The first and third transistors are coupled to together at a third node. The second and fourth transistors are coupled together at a fourth node. In a first phase of operation, the circuit receives the input voltage and the reference voltage. The input voltage and the reference voltage are applied to the first and second nodes using two switches until the first and second nodes have sampled the voltages (via parasitic capacitance). In a second phase of operation, the circuit operates as an amplifier. The two inverters amplify the difference in voltages at the first and second nodes by passing increasing current from the third node to the fourth node, which passes through both inverters. Next, in a third phase of operation, the circuit operates as a latch. A high logic voltage ($V_{DD}$) is applied to the third node and a low logic voltage ($V_{SS}$) is applied to the fourth node. At this point, if the input voltage is greater than the reference voltage, then the first node pulled-up to $V_{DD}$ and the second node pulled down to $V_{SS}$. If the input voltage is less than the reference voltage, then the first node assumes the voltage $V_{SS}$ and the second node is pulled-up to $V_{DD}$. Finally, in fourth phase of operation, the circuit outputs can be measured by sensing the voltages at the first and second nodes (in this phase, the outputs of the circuit).

3 Claims, 2 Drawing Sheets

FAST COMPARATOR CIRCUIT

This is a continuation of application Ser. No. 08/163,957 filed Dec. 8, 1993, now abandoned.

BACKGROUND OF THE INVENTION

1. Field of the Invention

The present invention relates to a fast comparator circuit.

2. Related Art

A comparator is a circuit that compares two input voltages and makes a decision as to which of the two inputs is greater. FIG. 1 illustrates a simplified block diagram of a standard fast comparator 100. Fast comparator 100 includes an input amplifier 102 and a latch 104. Fast comparator 100 compares an input voltage $V_{IN}$ to a reference voltage $V_{REF}$ and produces complimentary outputs Q and $\overline{Q}$ where: when Q=1, $\overline{Q}$=0, then $V_{REF} < V_{IN}$, and when Q=0, $\overline{Q}$=1, then $V_{REF} > V_{IN}$.

It is convenient to think of a comparator as an ideal switching circuit for which any small differential input voltage, however small, results in a sudden change at the output. In reality, the switching performance of a comparator 100 depends on the gain properties of the amplifier 102. Smaller input signals tend to cause a greater propagation delay and a slower rise or fall time at the output of comparator 100. So the amplifier is a very important element of the fast comparator 100.

Once the amplifier 102 completes amplification, an amplified differential voltage $V_{REF}-V_{IN}$ can be latched by the latch 104. The amplifier 102 must provide sufficient amplification of the differential voltage or the latch 102 will make a wrong decision due to noise at the input of the latch.

On an IC chip, comparators 100 are widely used for many different applications. For example, comparators 100 are used in flash converters with one flash converter typically having 100 or more comparators.

Therefore, there is a need to reduce the size of conventional comparators so that they occupy less area (e.g., real estate) on a chip. There is also a need to reduce the number of transistors a comparator 100 employs to reduce their power consumption and increase their speed.

SUMMARY OF THE INVENTION

The present invention significantly reduces the area and power requirements of a comparator by combining the latch and amplification stages of conventional comparators into one circuit.

The circuit compares an input signal having a first voltage to a reference signal having a second voltage to determine whether the input signal voltage is greater than or less than the reference signal voltage.

In a preferred embodiment, the circuit is essentially comprised of four transistors (two inverters). First and second complimentary transistors are coupled in series to form the first inverter. Third and fourth complimentary transistors are coupled in series to form the second inverter. Between the first and second complimentary transistors is a first node and between the third and fourth transistors is a second node. The first and third transistors are coupled to together at a third node. The second and fourth transistors are coupled together at a fourth node.

In a first phase of operation, the circuit receives the input voltage and the reference voltage. The input voltage and the reference voltage are applied to the first and second nodes using two switches until the first and second nodes have sampled the voltages (via parasitic capacitance).

In a second phase of operation, the circuit operates as an amplifier. The two inverters amplify the difference in voltages at the first and second nodes by passing increasing current from the third node to the fourth node, which passes through both inverters.

Next, in a third phase of operation, the circuit operates as a latch. A high logic voltage ($V_{DD}$) is applied to the third node and a low logic voltage ($V_{SS}$) is applied to the fourth node. At this point, if the input voltage is greater than the reference voltage, then the first node pulled-up to $V_{DD}$ and the second node pulled down to $V_{SS}$. If the input voltage is less than the reference voltage, then the first node assumes the voltage $V_{SS}$ and the second node is pulled-up to $V_{DD}$.

Finally, in fourth phase of operation, the circuit outputs can be measured by sensing the voltages at the first and second nodes (in this phase, the outputs of the circuit).

One feature of the present invention, is that the two inverters are used to accomplish the goals of comparator—an amplifier and latch. As a result, the power requirements of the comparator are reduced; the area requirements of the comparator are reduced; and the speed of the comparator is improved.

Further features and advantages of the present invention, as well as the structure and operation of various embodiments of the present invention, are described in detail below with reference to the accompanying drawings.

DETAILED DESCRIPTION OF THE PREFERRED EMBODIMENTS

Figure 1:
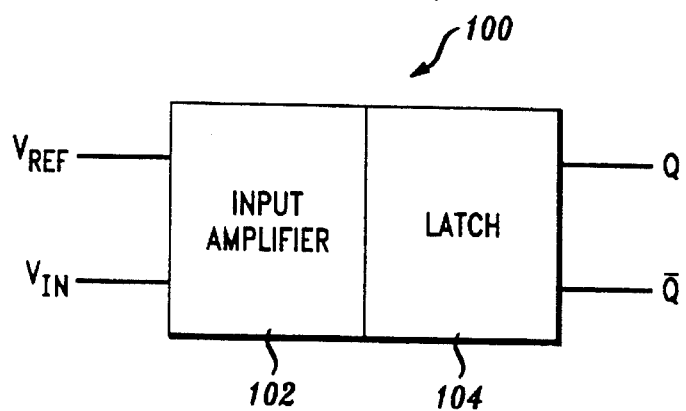
FIG. 1 illustrates a simplified block diagram of a standard fast comparator 100.
Figure 2:
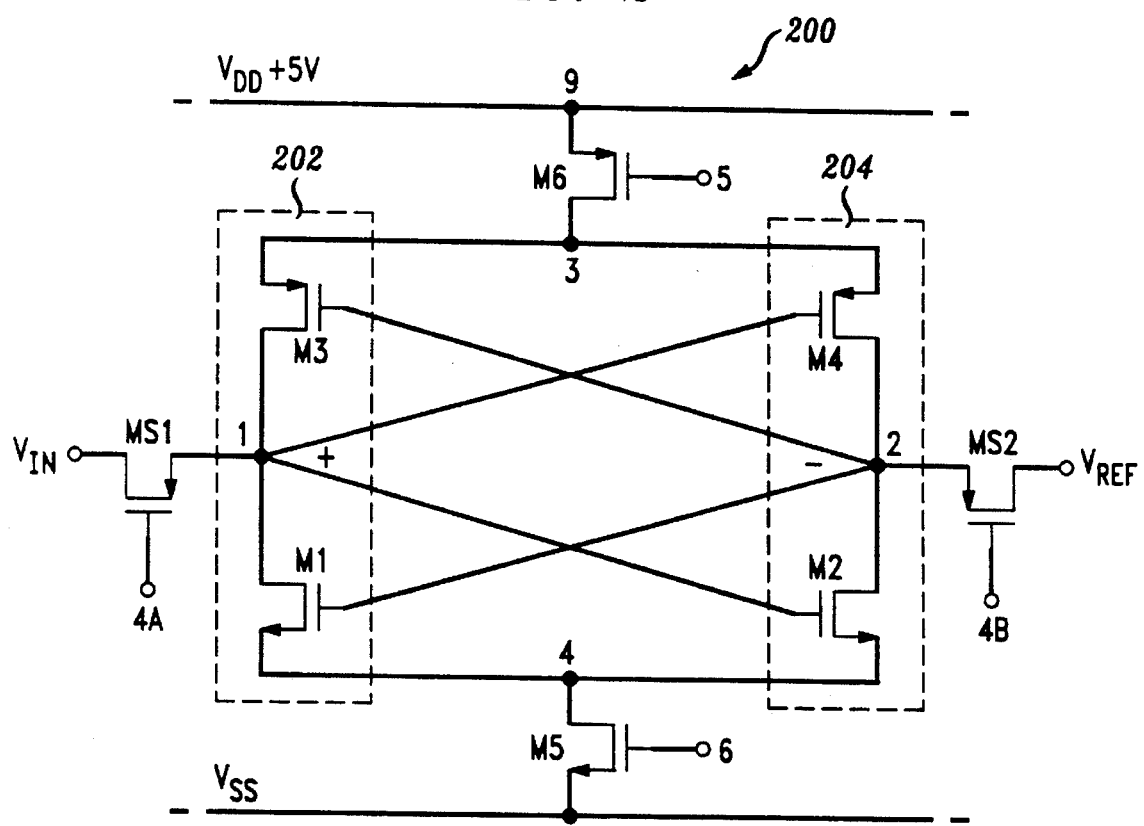
FIG. 2 is circuit diagram of a fast comparator 200 according to the preferred embodiment of the present invention.

FIG. 2 is circuit diagram of a fast comparator 200 according to the preferred embodiment of the present invention. As will be explained in more detail below, fast comparator 200 is an amplifier and latch in one (utilizing the same transistors). In this way fast comparator 200 avoids the two stage operation of a conventional comparator 100 as shown in FIG. 1, thereby reducing the number of transistors.

Referring to FIG. 2, in a preferred embodiment fast comparator 200 is implemented using Complimentary Metal Oxide Silicon (CMOS) technology. Fast comparator 200 includes two inverters 202 and 204, which are coupled together at nodes 1, 2, 7 and 8. Inverter 202 includes transistors M1 and M3, and inverter 204 includes transistors M2 and M4. Transistors M1, M2, M3 and M4 form a latch and an amplifier as will be explained. In the preferred embodiment, transistors M1, M2 are N-channel devices and transistors M3, M4 are P-channel devices.

Gates of transistors M1 and M3 are coupled to node 2, which is the input of inverter 202. The output of inverter 202 is node 1. Gates of transistors M2 and M3 are coupled to node 1, which is the input of inverter 204. The output of inverter 204 is node 2.

In a preferred embodiment, transistor M5 is an N-channel device and transistor M6 is a P-channel device. Transistors M6 and M5 first act as current source and sink, respectively, and subsequently act as switches that enable nodes 3 and 4 to be connected to $V_{DD}$ and $V_{SS}$, respectively. That is, inverters 202 and 204 are coupled to $V_{DD}$ at node 3 via transistor M6, and inverters 202 and 204 are coupled to $V_{SS}$ at node 4 via transistor M5, when transistors M5 and M6 are switched-on.

Transistors MS1 and MS2 are switches that enable transistors M1, M2, M3 and M4 to be connected to an input voltage ($V_{IN}$) and a reference voltage ($V_{REF}$). That is, inverters 202 and 204 are coupled to $V_{IN}$ at node 1 via transistor MS1 and are coupled to $V_{REF}$ at node 2 via transistor MS2. Transistors MS1 and MS2 are N-channel devices.

Fast comparator 200 operates as follows. Transistors M1, M2, M3 and M4 are initially configured to function as an amplifier to amplify the difference $V_{REF}-V_{IN}$. In this mode, M6 acts as a current source and M5 acts as a current sink. Transistors M1, M2 and M5 act as an N-channel differential amplifier. Transistors M3, M4 and M6 form a P-channel differential amplifier. These amplifiers perform in parallel and are connected to form a positive feedback configuration to amplify the voltage across nodes 1 and 2, which is the difference between applied voltages $V_{IN}$ and $V_{REF}$. Once the signals at nodes 1 and 2 are sufficiently amplified, the same transistors M1, M2, M3 and M4 are configured as a latch to latch the amplified result of $V_{REF}-V_{IN}$. In this way, transistors M1, M2, M3 and M4 are connected as an amplifier and then a latch. Transistors MS1, MS2, M5 and M6 control when transistors M1, M2, M3 and M4 to function as an amplifier and then a latch. The latched result can then be sensed as a voltage between nodes 1 and 2 using conventional circuitry not shown. Alternatively, the output at nodes 1 and 2 is coupled to other circuitry (not shown) requiring the latched result to perform another function.

Figure 3:
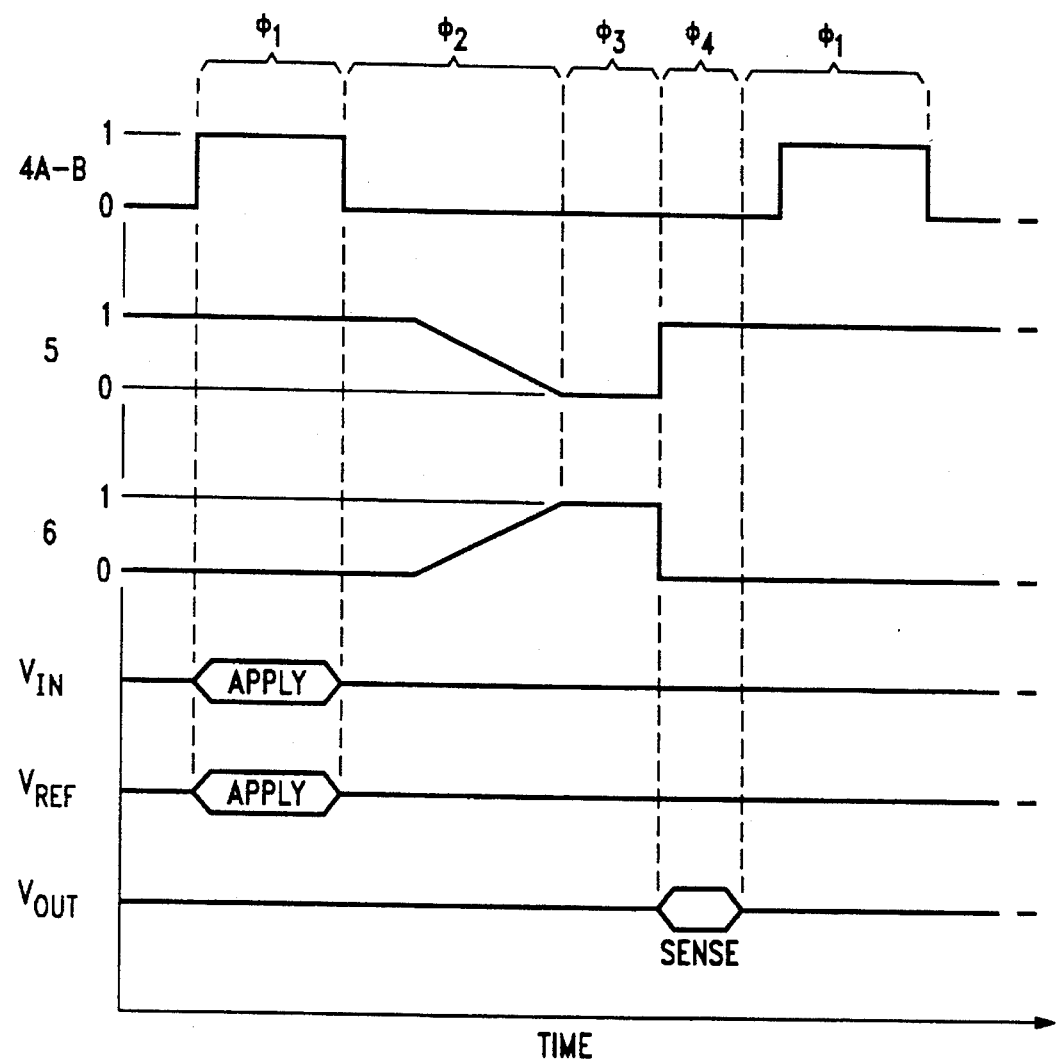
FIG. 3 is a timing diagram showing four distinct phases φ1–φ4 of the operation of fast comparator 200, according to the preferred embodiment of the present invention.

The detailed operation of fast comparator 200 will now be described with reference to FIG. 3. FIG. 3 is a timing diagram showing four distinct phases φ1–φ4 of the operation of fast comparator 200, according to the preferred embodiment of the present invention. Each phase is approximately 2.5 nanoseconds. The timing is partly dictated by the size of the FETs. The FETs use small channel length (typically less than 1 micrometer) for fast operation. Their widths are adjusted according to the capacitance load that is needed to be driven for a given application.

Referring to FIGS. 2 and 3, in phase φ1 the voltages at $V_{IN}$ and $V_{REF}$ are sampled. This is accomplished by applying a logic 1 voltage (e.g., 5V) at gates 4A and 4B of N-channel transistors MS1 and MS2. Simultaneously, voltages applied at $V_{IN}$ and $V_{REF}$ are transferred to nodes 1 and 2, since transistors MS1 and MS2 are turned-on. Nodes 1 and 2 then behave as capacitors by sampling and holding the voltages of $V_{IN}$ and $V_{REF}$. Nodes 1 and 2 act as capacitors, since there is parasitic capacitance at these nodes. After capacitors at nodes 1 and 2 have had a chance to charge-up, (approximately 2.5 nanoseconds) transistors MS1 and MS2 are turned-off by returning gates 4A and 4B to logic 0 as shown in FIG. 3. Additionally, $V_{IN}$ and $V_{REF}$ are effectively disconnected and are no longer applied as voltage inputs.

Next, in phase φ2, power is applied to the circuit by ramping-up the magnitude of the gate and source voltages M5 and M6 from less than the threshold voltage, to a value greater than the threshold voltages. In FIG. 3, voltages at nodes 5 and 6 are shown as linearly decreasing and increasing, respectively. This is for convenience, but these voltages can be accomplished in a variety of different ways. In fact, all the transistors M1–M6, operate in the sub-threshold region for a period of time, where their behavior is like that of bi-polar transistors. This is an important feature of the present invention. At this stage, transistors M1, M2, M3 and M4 act as a differential amplifiers. That is, as transistors M5 and M6 are gradually turned-on, they act as current sources. Current flows from $V_{DD}$ to $V_{SS}$ charging up capacitors at nodes 1 and 2 with current proportional to the difference in voltages of $V_{IN}$ and $V_{REF}$. In other words, when M5 and M6 are ramped-up they are current sources and the negative resistance between $V_{IN}$ and $V_{REF}$ charges up the capacitance between nodes 1 and 2.

In φ3, full power is applied to transistors M1, M2, M3 and M4 as voltages at gates 5 and 6, reach logic 0 and 1, respectively. This connects $V_{DD}$ and $V_{SS}$ to nodes 3 and 4, respectively. Thus, in φ3 transistors M5 and M6 fully are switched-on. Now, transistors M1, M2, M3 and M4 collectively act as a latch. If $V_{IN}>V_{REF}$, then node 1 is pulled-up to $V_{DD}$ (node 1=logic 1) and node 2 is pulled-down to $V_{SS}$ (node 2=logic 0). If $V_{IN}<V_{REF}$, then node 1 is pulled-down to $V_{SS}$ and node 2 is pulled-up to $V_{DD}$. After approximately 2 nanoseconds, $V_{DD}$ and $V_{SS}$ are disconnected by opening transistors M5 and M6 (gate 5 goes to logic 1 and gate 6 goes to logic 0).

In φ4, the voltages at nodes 1 and 2 are measured ($V_{OUT}$). This is accomplished by measuring the voltages at nodes 1 and 2 through additional switches (not shown) which connect nodes 1 and 2 to other logic gates (not shown). This is shown as "SENSE" for $V_{OUT}$ in the timing diagram of FIG. 3.

Thus, as shown in the figures and described above, the number of switches required as well as the complexity of a comparator circuit can be reduced, to essentially four transistors, which act as an amplifier and a latch (eliminating the need to employ two distinct stages). As a result, the present invention is fast, power efficient and occupies a small area.

Those skilled in that art will appreciate that the present invention can be practiced by other than the embodiments described, which are present for purposes of illustration and not of limitation, and the present invention is limited only by the claims that follow.

What is claimed is:

1. A method for comparing an input signal having a first voltage to a reference signal having a second voltage to determine whether said first voltage is greater than or less than said second voltage in a circuit which includes:

a first inverter comprising a first pair of complementary transistors coupled in series forming a first node therebetween;

a second inverter comprising a second pair of complementary transistors coupled in series forming a second node therebetween;

wherein said first pair of complementary transistors have gates coupled to said second node and said second pair of complementary transistors having gates coupled to said first node;

wherein said first and second inverters are coupled in parallel between third and fourth nodes;

a first transistor interposed between a first power supply voltage and said third node;

a second transistor interposed between a second power supply voltage and said fourth node;

a third transistor interposed between the input signal and said first node;

a fourth transistor interposed between the reference signal and said second node;

the method comprising the steps of:

simultaneously applying the input signal to said first node and the reference signal to said second node for a first discrete time period;

during a second discrete time period, ramping a gate voltage of said first transistor and a gate voltage of said second transistor, said first and second transistors operating as current sources, said first and second pair of complementary transistors acting as differential amplifiers, said first and second pair of complementary transistors charging capacitances at said first and second nodes with currents which are proportional to a voltage difference between said first voltage and said reference voltage;

during a third discrete time period, latching a voltage of said first node to one of a logical 0 and a logical 1 and latching a voltage of said second node to an other one of said logical 0 and said logical 1 by setting said gate voltage of said first transistor to one of said logical 0 and said logical 1 and setting said gate voltage of said second transistor to an other one of said logical 0 and logical 1, said first and second transistors being ON and fully conductive; and during a fourth discrete time period, measuring said voltage of said first node and said voltage of said second node and outputting one of said logical 0 and said logical 1 based on a difference between said voltage of said first node and said voltage of said second node, wherein each of the first through the fourth discrete time periods is approximately 2.5 nanoseconds.

2. The method of claim 1, further comprising disconnecting the input signal from said first node and said reference signal from said second node after said first discrete time period.

3. The method of claim 1, wherein said ramping gate voltages of said first and second transistors comprises linearly decreasing and increasing said gate voltages of said first and second transistor, respectively.

* * * * *